(12) United States Patent
Biber

(10) Patent No.: US 12,241,955 B2
(45) Date of Patent: Mar. 4, 2025

(54) METHOD FOR ASCERTAINING AN ITEM OF MOVEMENT INFORMATION

(71) Applicant: Siemens Healthineers AG, Forchheim (DE)

(72) Inventor: Stephan Biber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 124 days.

(21) Appl. No.: 18/106,599

(22) Filed: Feb. 7, 2023

(65) Prior Publication Data

US 2023/0251339 A1     Aug. 10, 2023

(30) Foreign Application Priority Data

Feb. 9, 2022  (DE) ...................... 10 2022 201 313.1

(51) Int. Cl.
    G01R 33/563     (2006.01)
    G01R 33/565     (2006.01)

(52) U.S. Cl.
    CPC . *G01R 33/56308* (2013.01); *G01R 33/56509* (2013.01)

(58) Field of Classification Search
    CPC ................ G01R 33/56308; G01R 33/56509
    See application file for complete search history.

(56) References Cited

U.S. PATENT DOCUMENTS

| 10,222,443 | B2 | 3/2019 | Bollenbeck et al. |
| 10,393,845 | B2 | 8/2019 | Schröter et al. |
| 12,055,614 | B2 * | 8/2024 | Bacher ............. G01R 33/56509 |
| 2014/0070807 | A1 | 3/2014 | Biber |

(Continued)

FOREIGN PATENT DOCUMENTS

| DE | 102012216292 A1 | 5/2014 |
| EP | 3742184 A1 | 11/2020 |

OTHER PUBLICATIONS

Kim, Daeun, et al. "Region-optimized virtual (ROVir) coils: Localization and/or suppression of spatial regions using sensor-domain beamforming." Magnetic Resonance in Medicine 86.1 (2021): 197-212.

Speier, P., M. Fenchel, and R. Rehner. "PT-Nav: a novel respiratory navigation method for continuous acquisitions based on modulation of a pilot tone in the MR-receiver." Magn Reson Mater Phys Biol Med 28 (2015): S97-S98.

(Continued)

*Primary Examiner* — Steven L Yeninas
(74) *Attorney, Agent, or Firm* — Lempia Summerfield Katz LLC

(57) ABSTRACT

Systems and methods for ascertaining an item of movement information concerning movement of an object under examination during a magnetic resonance scan. A pilot tone signal generator of a magnetic resonance apparatus transmits a pilot tone signal. At least one first coil element of the magnetic resonance apparatus receives the pilot tone signal. The pilot tone signal received by the at least one first coil element is in each case a first pilot tone received signal. At least one second coil element of the magnetic resonance apparatus receives the pilot tone signal. The pilot tone signal received by the at least one second coil element is in each case a second pilot tone received signal. The at least one first pilot tone received signal is corrected with the aid of the at least one second pilot tone received signal. The item of movement information for the object under examination is ascertained using the corrected at least one first pilot tone received signal.

20 Claims, 5 Drawing Sheets

(56) References Cited

U.S. PATENT DOCUMENTS

2018/0353140 A1* 12/2018 Speier ................ G01R 33/5673
2020/0150201 A1*  5/2020 Dornberger .......... G01R 33/341
2021/0121131 A1   4/2021 Biber
2022/0206098 A1   6/2022 Leussler et al.
2022/0361822 A1* 11/2022 Speier .............. G01R 33/56509

OTHER PUBLICATIONS

Vijaykumar, Abhishek. Pilot Tone Signal Optimization for Cardiac Magnetic Resonance Imaging. Diss. The Ohio State University, 2021. p. 1-50.

* cited by examiner

FIG 3
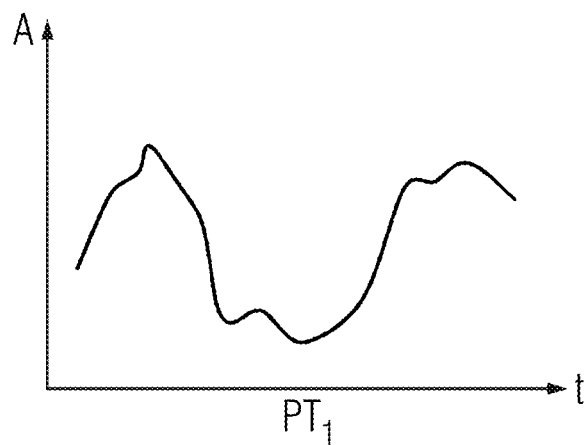
PT₁
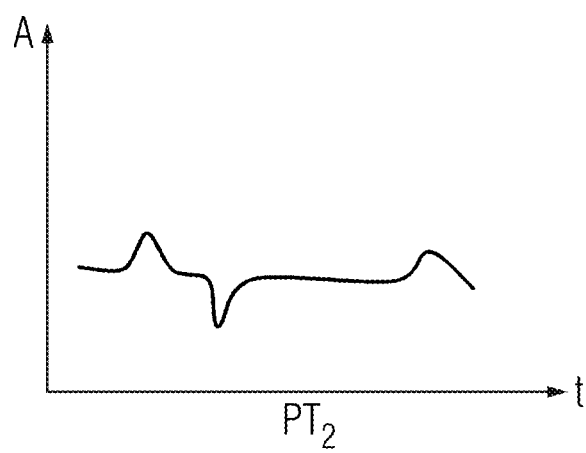
PT₂
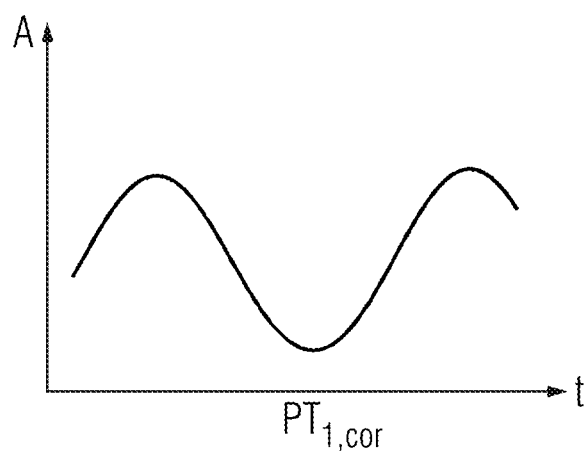
PT$_{1,cor}$

METHOD FOR ASCERTAINING AN ITEM OF MOVEMENT INFORMATION

CROSS REFERENCE TO RELATED APPLICATIONS

This application claims the benefit of DE 10 2022 201 313.1 filed on Feb. 9, 2022, which is hereby incorporated by reference in its entirety.

FIELD

Embodiments relate to a method for ascertaining an item of movement information concerning movement of an object under examination during a magnetic resonance scan.

BACKGROUND

In medical technology, imaging by magnetic resonance (MR), also referred to as magnetic resonance tomography (MRT), is characterized by high soft-tissue contrast. During a magnetic resonance scan of an object under examination, a magnetic resonance apparatus radiates radio-frequency (RF) signals, for example pulses to generate an RF field and gradient pulses to generate magnetic field gradients, into an examination region in which the object under examination is located. As a result, spatially encoded magnetic resonance signals are triggered in the object under examination. The object under examination may, for example, be a human or veterinary patient.

The magnetic resonance signals are received by the magnetic resonance apparatus and used to reconstruct magnetic resonance images. This magnetic resonance signal is, for example, received by local receive coils, so-called local coils, arranged directly on the object under examination to achieve a better signal-noise ratio (SNR). The local coils may include one or more coil elements configured to receive RF signals, for example magnetic resonance signals.

The publications U.S. Ser. No. 10/222,443 B2 and Speier et al. PT-Nav: A Novel Respiratory Navigation Method for Continuous Acquisition Based on Modulation of a Pilot Tone in the MR-Receiver. ESMRMB, 129:97-98, 2015 disclose a method that provides movement information to be ascertained based on received pilot tone signals. This provides movement artifacts to be avoided (prospective movement correction) and/or eliminated in the course of digital postprocessing (retrospective movement correction).

Herein, a weak sufficiently constant radio frequency pilot tone signal, for example with regard to amplitude and/or frequency, is usually emitted by a usually small pilot tone signal generator. A pilot tone signal generator of this kind is, for example, described in the publication U.S. Ser. No. 10/393,845 B2. The emitted pilot tone signal interacts with the object under examination, i.e., it is influenced by the object under examination, and is then received by one or more coil elements of one or more receive coils, for example coil elements of the local coils, as a pilot tone received signal. (Such a receive coil may, of course, also be configured to transmit RF signals, i.e., it may also be a transmit-receive coil). As described above, the receive coils are usually simultaneously used for imaging, i.e., for receiving magnetic resonance signals.

Spectral separation of the pilot tone received signal from the magnetic resonance signal in the received RF signal allows interference-free pick-up of imaging magnetic resonance signals and simultaneous reception of the pilot tone signal. The amplitude and phase of the pilot tone received signals may then be used to pick up the temporal course of physiological movements, such as respiration and/or heart-beat. The magnetic resonance signals of the received RF signals are used to reconstruct magnetic resonance images.

However, the pilot tone received signal may be subject to interference. This may be disadvantageous if the interference lies in a frequency range that is also typical of a movement to be detected, for example for respiratory rates (0.1-2 Hz) or heart rates (40-180 Hz). Such interference may, for example, be caused by vibrations in the magnetic resonance apparatus and transmitted to the pilot tone received signal. Although such vibrations may be attenuated by attaching damping material, this requires space and results in costs.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments make the pilot tone received signal less sensitive to interference.

Accordingly, a method, for example a computer-implemented method, for ascertaining an item of movement information concerning movement of an object under examination during a magnetic resonance scan is provided. A pilot tone signal generator of a magnetic resonance apparatus transmits a pilot tone signal. At least one first coil element of the magnetic resonance apparatus receives the pilot tone signal. The pilot tone signal received by the at least one first coil element is in each case a first pilot tone received signal, i.e., it is hereinafter referred to as such. For example, the at least one first coil element of the magnetic resonance apparatus in each case receives at least one first received signal comprising the pilot tone signal. The pilot tone signal received by the at least one first coil element is in each case a first pilot tone received signal. At least one second coil element of the magnetic resonance apparatus receives the pilot tone signal. The pilot tone signal received by the at least one second coil element is in each case a second pilot tone received signal, i.e., it is hereinafter referred to as such. For example, the at least one second coil element of the magnetic resonance apparatus in each case receives a second received signal including the pilot tone signal. The pilot tone signal received by the at least one second coil element is in each case a second pilot tone received signal. The at least one first pilot tone received signal is corrected with the aid of the at least one second pilot tone received signal. The item of movement information for the object under examination is ascertained, for example calculated, using the corrected at least one first pilot tone received signal.

Advantageously, the corrected at least one first pilot tone received signal includes fewer interference components, so that the item of movement information ascertained therefrom is also more accurate and/or more reliable.

The object under examination may, for example, be a human or veterinary patient. The movement of the object under examination may be a physiological movement, for example a movement of the patient's heart and/or abdomen.

For example, the pilot tone signal is radiated into an examination region of the magnetic resonance apparatus in which the object under examination is located. The pilot tone signal is configured to be influenced by a movement of the object under examination.

For example, there is physical interaction between the transmitted pilot tone signal with the object under examination. For example, the transmitted pilot tone signal is influenced by a movement of the object under examination.

The magnetic resonance apparatus includes at least one first coil element, for example a plurality of first coil elements. The at least one first coil element may be a plurality of coil elements. For example, each of the plurality of first coil elements in each case receives a first received signal, for example a first pilot tone received signal. The first received signal may include the first pilot tone received signal. In particular, the first received signal may further include a first magnetic resonance signal.

The first received signal may for example be described as: $S_1 = PT_1 + MR_1$, wherein S1 is the first received signal, $PT_1$ is the first pilot tone received signal and $MR_1$ is the first magnetic resonance signal.

For example, therefore, each of the plurality of first coil elements in each case receives a first magnetic resonance signal. The first pilot tone received signal and the first magnetic resonance signal may be spectrally separated, i.e., they may lie in different receiving frequency bands. However, it is also conceivable that the first pilot tone received signal and the first magnetic resonance signal lie in the same receiving frequency band and/or in overlapping receiving frequency bands.

The magnetic resonance apparatus includes at least one second coil element, for example a plurality of second coil elements. The at least one second coil element may be a plurality of coil elements. For example, each of the plurality of second coil elements in each case receives a second received signal, for example a second pilot tone received signal.

The second received signal may include a second pilot tone received signal. In particular, the second received signal may include a second magnetic resonance signal.

The second received signal may for example be described as follows: $S_2 = PT_2 + MR_2$, wherein $S_2$ is the second received signal, $PT_2$ is the second pilot tone received signal and $MR_2$ is the second magnetic resonance signal. For example, the second magnetic resonance signal is vanishing, i.e., the second received signal only includes the second pilot tone received signal.

Just like the first pilot tone received signal and the first magnetic resonance signal, the second pilot tone received signal and the second magnetic resonance signal may also be spectrally separated, i.e., they may lie in different frequency bands. However, it is also conceivable that the second pilot tone received signal and the second magnetic resonance signal lie in the same receiving frequency band and/or in overlapping receiving frequency bands.

The process of transmitting the pilot tone signal and receiving the first pilot tone received signal and/or the second pilot tone received signal may be performed repeatedly during the magnetic resonance scan.

This correction of the at least one first pilot tone received signal may, for example, take place by a system control unit of the magnetic resonance apparatus. The ascertaining of an item of movement information for the object under examination using the corrected at least one first pilot tone received signal may also, for example, take place by a system control unit of the magnetic resonance apparatus. The system control unit includes, for example, one or more processors and/or storage modules.

Magnetic resonance signals may be picked up during the magnetic resonance scan. The magnetic resonance signals may for example be received, at least partially, by the same coil elements by which the pilot tone signal, for example the at least one first pilot tone received signal and/or the at least one second pilot tone received signal, is also received. For example, such coil elements have a receiving frequency band including both the frequency band of the magnetic resonance signals and the frequency band of the pilot tone signals, for example the at least one first pilot tone received signal and/or the at least one second pilot tone received signal.

To generate the at least one first pilot tone received signal and/or the at least one second pilot tone received signal, for example, pilot tone signals that interact with the object under examination are generated by a pilot tone signal generator. The pilot tone signals are RF signals. A coil element receiving the pilot tone signal may for example be part of a coil, for example a local coil and/or a body coil permanently installed in the magnetic resonance apparatus. A coil element receiving the pilot tone signal may be configured to transmit the received pilot tone signal for ascertaining the item of movement information for the object under examination, for example for evaluating information about a physiological process in the object under examination, to a system control unit of the magnetic resonance apparatus.

The pilot tone signal generator may, for example, be part of a local coil, for example integrated or installed in a local coil. Advantageously, this provides the pilot tone signal generator to be positioned particularly close to the object under examination so that the pilot tone signals received by the coil elements advantageously have a particularly high SNR.

The pilot tone signal transmitted by the pilot tone signal generator may include a first frequency band. The receiving coil element is configured to pick up a receiving frequency band including the first frequency band. For example, the magnetic resonance apparatus includes a radio-frequency antenna unit configured to output an RF pulse or an RF Signal with a second frequency band, for example according to a Larmor frequency. The receiving coil elements may be configured to receive a magnetic resonance signal of the RF pulse. The magnetic resonance signal includes a third frequency band, for example according to the Larmor frequency, for example lying, at least substantially, outside the first frequency band. Advantageously, the first frequency band does not collide with the actual measurement signal, the magnetic resonance signal lying in the third frequency band. However, the third frequency band may lie wholly or partially within the first frequency band. Suitable methods also exist for this purpose in order to separate the magnetic resonance signal and the received pilot tone signal for further processing, for example for correcting the at least one first pilot tone received signal with the aid of the at least one second pilot tone received signal.

Such a separation T of the first pilot tone received signal $PT_1$ from the first received signal $S_1$ may, for example, be described as follows: $T(S_1) = PT_1$. Such a separation T of the second pilot tone received signal $PT_2$ from the second received signal $S_2$ may, for example, be described as follows: $T(S_2) = PT_2$. For example, at least one magnetic resonance image is reconstructed from the picked-up magnetic resonance signals. The reconstruction of the at least one magnetic resonance image may, for example, take place by a system control unit of the magnetic resonance apparatus.

The ascertaining of the item of movement information for the object under examination using the corrected at least one first pilot tone received signal may take place during the magnetic resonance scan of the object under examination, after the magnetic resonance scan of the object under examination, or partially during the magnetic resonance scan and after the magnetic resonance scan of the object under examination. Ascertaining the item of movement information during the magnetic resonance scan of the object under examination is for example suitable for prospective movement correction of the magnetic resonance signals picked up during a magnetic resonance scan. Ascertaining the item of movement information after the magnetic resonance scan of the object under examination is for example suitable for retrospective movement correction of the magnetic resonance signals picked up during a magnetic resonance scan.

The at least one second coil element may include a lower sensitivity for capturing the movement of the object under examination than the at least one first coil element. For example, a second pilot tone received signal received by a second coil element includes a smaller change, for example in the amplitude and/or phase of the pilot tone signal, relative to a movement of the object under examination than a first pilot tone received signal received by a first coil element. The sensitivity may, for example, be caused by a position, for example relative to the object under examination, and/or orientation, for example relative to the object under examination, and/or the shape and/or size of the respective coil element. For example, a coil element mounted closer to the location of the movement of the object under examination may be more sensitive than a coil element mounted further away therefrom.

The at least one second coil element may be configured to receive pilot tone signals that are influenced to a lesser degree by the movement of the object under examination. For example, the at least one second pilot tone received signal is influenced to a lesser degree by the movement of the object under examination than the at least one first pilot tone received signal.

The at least one first pilot tone received signal may include a signal component representing the movement of the patient during the magnetic resonance scan. The at least one second pilot tone received signal ideally does not include a signal component representing the movement of the patient during the magnetic resonance scan.

The at least one first pilot tone received signal and the at least one second pilot tone received signal may include an interference signal, for example a common and/or identical and/or similar interference signal. For example, the at least one first pilot tone received signal and the at least one second pilot tone received signal in each case include an interference signal with an identical source. Advantageously, during the correction of the at least one first pilot tone received signal with the aid of the at least one second pilot tone received signal, the interference signal in the at least one first pilot tone received signal may be reduced, or completely removed from the at least one first pilot tone received signal.

The interference signal may, for example, be caused by a, for example human, movement (for example of an operator) in the room in which the magnetic resonance apparatus is located, and/or an, for example vibrating, component of the magnetic resonance apparatus, for example a coolant line. The interference signal may for example have a frequency of less than 50 Hz; such interference signals are particularly harmful because they lie in a frequency range in which a heart movement and/or a respiratory movement of an object under examination, for example a human patient, also lies. Reducing the interference signal according to the proposed method advantageously provides complex technical measures, such as, for example, insulation, for example acoustic insulation of the coolant lines, to be avoided.

The correction of the at least one first pilot tone received signal with the aid of the at least one second pilot tone received signal may include a, for example weighted, subtraction of the at least one second pilot tone received signal from the at least one at least one first pilot tone received signal.

At least one second pilot tone received signal including an interference signal is subtracted from the at least one first pilot tone received signal including the interference signal and a movement signal of the movement of the object under examination so that the movement signal remains as the corrected at least one first pilot tone signal. The signals are weighted during the subtraction such that the reduction of the interference signal is maximized.

At least one, for example complex-valued, weighting factor may be ascertained. The subtraction of the at least one second pilot tone received signal from the at least one at least one first pilot tone received signal is performed with the aid of the at least one weighting factor.

For example, a weighting matrix including a plurality of weighting factors may be ascertained. The subtraction of the at least one second pilot tone received signal from the at least one first pilot tone received signal is performed with the aid of the weighting matrix.

The correction may, for example, be formulated as follows: $PT_{1,cor} = PT_1 - G \cdot PT_2$ Herein, $PT_{1,cor}$ is a corrected first pilot tone received signal, $PT_1$ is a (uncorrected) first pilot tone received signal, G is a, for example complex-valued, weighting factor and $PT_2$ is a second pilot tone received signal. In the case of M first pilot tone received signals and N second pilot tone received signals, the weighting factor G may also be represented as a matrix of M×N weighting factors. $PT_{1,cor}$ is a pilot tone received signal freed from the interference signal.

The correction of the at least one first pilot tone received signal may take place using a sidelobe canceller method.

The correction of the at least one first pilot tone received signal may include transformation of the at least one second pilot tone received signal into an orthonormal basis, i.e., $PT_2 \rightarrow PT_{2,orthonorm}$. This may, for example, take place with the aid of principal component analysis (PCA) or a method similar thereto.

The correction of the at least one first pilot tone received signal may include transformation of the at least one first pilot tone received signal into an orthonormal basis, i.e., $PT_1 \rightarrow PT_{1,orthonorm}$.

The the correction of the at least one first pilot tone received signal may further include calculating a correlation, for example a correlation matrix K1 between the at least one transformed second pilot tone received signal $PT_{2,orthonorm}$ and the at least one first pilot tone received signal $PT_1$.

The correction of the at least one first pilot tone received signal may further include calculating a correlation, for example a correlation matrix K2 between the at least one second pilot tone received signal $PT_2$ and the at least one transformed first pilot tone received signal $PT_{1,orthonorm}$.

If the at least one first pilot tone received signal includes, for example, a selection $N_1$ of first pilot tone received signals and the at least one second pilot tone received signal includes, for example, a number $N_2$ of second pilot tone received signals, the signals may for example be expressed by an $N_1 \times N_2$ matrix K1 or K2.

The correction of the at least one first pilot tone received signal may further include a subtraction of the at least one transformed second pilot tone received signal $PT_{2,orthonorm}$ weighted by the correlation matrix K1, for example the correlation coefficients of the correlation matrix K1, from the at least one first pilot tone received signal $PT_1$.

The correction of the at least one first pilot tone received signal may further include a subtraction of the at least one second pilot tone received signal $PT_{2,orthonorm}$ weighted by the correlation matrix K2, for example the correlation coefficients of the correlation matrix K2, from the at least one transformed first pilot tone received signal $PT_{1,orthonorm}$.

This yields the at least one corrected pilot tone received signal $PT_{1,cor}$. Advantageously, this then has less interference, ideally no interference.

The correction of the at least one first pilot tone received signal may take place using a trained function. The at least one first pilot tone received signal and the at least one second pilot tone received signal are received as input data of the trained function, whereupon the trained function is applied. The corrected at least one first pilot tone received signal is output as output data of the trained function.

A trained function maps input data to output data. In this case, the output data for example may still depend on one or more parameters of the trained function. The one or more parameters of the trained function may be determined and/or adapted by training. The determination and/or the adaptation of the one or more parameters of the trained function may for example be based on training a pair consisting of input data and associated training output data. The trained function is applied to the training input data to generate training mapping data. For example, the determination and/or adaptation may be based on a comparison of the training mapping data and the training output data. In general, a trainable function, i.e., a function with one or more parameters that have not yet been adapted is also referred to as a trained function.

Other terms for trained function may, for example, be trained mapping rule, mapping rule with trained parameters, function with trained parameters, algorithm based on artificial intelligence or machine learning algorithm. One example of a trained function is an artificial neutral network. Edge weights of the artificial neutral network correspond to the parameters of the trained function. Instead of the term "neural network", it is also possible to use the term "neural net". For example, a trained function may also be a deep neural network" or "deep artificial neural network"). A further example of a trained function is a "support vector machine", furthermore, for example other machine learning algorithms may be used as trained functions.

The at least one second pilot tone received signal may be received repeatedly and/or continuously during the magnetic resonance scan. The correction of the at least one first pilot tone received signal is configured based on the repeatedly and/or continuously received at least one second pilot tone received signal during the magnetic resonance scan, for example continuously. For example, in parallel, for example simultaneously, with the reception of the at least one second pilot tone received signal, there is also reception of the at least one first pilot tone received signal, which is corrected with the aid of the at least one second pilot tone received signal For example, the reception of the at least one second pilot tone received signal takes place several times during the magnetic resonance scan. The correction of the at least one first pilot tone received signal is configured during the magnetic resonance scan based on the at least one second pilot tone signal that is received several times.

For example, during the magnetic resonance scan, the pilot tone signal generator of the magnetic resonance apparatus repeatedly, for example periodically, and/or continuously transmits a pilot tone signal that is received by the at least one first coil element and the at least one second coil element. At least part of the second pilot tone received signals received by the at least one second coil element is preferably used to adapt the correction of the at least one first pilot tone received signal.

The at least one second pilot tone received signal may be received repeatedly and/or continuously during the magnetic resonance scan. The at least one weighting factor is configured repeatedly, for example continuously during the magnetic resonance scan based on the repeatedly received at least one second pilot tone signal. For example, at least one initial weighting factor is ascertained as the at least one weighting factor even before the magnetic resonance scan is started. For example, calculation of the weighting factors is started before the start of the magnetic resonance scan. The precalculated weighting factors may be continuously adapted throughout the magnetic resonance scan.

The at least one second pilot tone received signal may be received repeatedly and/or continuously during the magnetic resonance scan. A strength of a (possible) adaption of a correction, for example of the at least one weighting factor, is ascertained in order to correct the at least one first pilot tone received signal with the aid of the repeatedly and/or continuously received at least one second pilot tone received signal during the magnetic resonance scan. The adaption only takes place if the strength of the adaption, for example of the at least one weighting factor, exceeds a predetermined threshold.

The at least one second coil element of the magnetic resonance apparatus (for the reception of the at least one second pilot tone received signal) may include at least one coil element that does not capture any magnetic resonance signals used to ascertain a magnetic resonance image during the magnetic resonance scan.

A second coil element (for the reception of the at least one second pilot tone received signal) may be a coil element of a local coil that is advantageously present anyway, but which is not used for imaging, i.e., which does not pick up any magnetic resonance signals used to ascertain a magnetic resonance image during the magnetic resonance scan. Such second coil elements may, for example, be coil elements at the foot end of a spine coil when a head examination is performed.

The magnetic resonance apparatus may include at least one dedicated coil element with the sole purpose of receiving a second pilot tone received signal. Such a second coil element may for example be a dedicated pick-up antenna arranged for example in a local coil, in a patient table, in a body coil installed in the magnetic resonance apparatus or on a casing of the magnetic resonance apparatus. For example, such a second coil element is arranged close to the point of origin of possible interference, for example close to the location of vibration, for example on a cold head of the magnetic resonance apparatus.

The at least one second coil element of the magnetic resonance apparatus may include at least one coil element configured and/or arranged in the magnetic resonance apparatus in such a way that an influence of vibration of the magnetic resonance apparatus may be captured as well as possible.

The at least one second coil element may include a greater distance to the location of the movement of the object under examination than the at least one first coil element. For example, coil elements at the foot end of a spine coil have a greater distance to the location of a heart movement than coil elements arranged on the patient's abdomen.

One embodiment of the method provides that the at least one second coil element is selected from a plurality of coil elements of the magnetic resonance apparatus. The selection of the at least one second coil element takes place in dependence on a position of the coil elements and/or using a patient model, i.e., a model of the object under examination.

The at least one second coil element may include the greatest possible distance to the location of the movement of the object under examination. As a result, the corrected at least one first pilot tone received signal contains a particularly high degree of information about the movement of the object under examination.

The at least one second coil element may include the shortest possible distance to the pilot tone signal generator. As a result, the at least one second pilot tone received signal includes a particularly high SNR.

Using the patient model ensures that any interference signals may be picked up and suppressed, but that signals containing information about the movement of the object under examination are not unintentionally suppressed. The patient model may for example include information about a location of a movement for which the item of movement information is to be ascertained. For example, the patient model may include a position of the heart (for a heart movement) and/or the abdomen (for a respiratory movement) of the object under examination.

Further, a magnetic resonance apparatus is provided that is configured to perform a method as described above. The magnetic resonance apparatus includes the components required to perform the method, such as, for example, a pilot tone signal generator, at least one coil element and/or a system control unit for signal correction and/or for ascertaining the item of movement information.

The advantages of the proposed magnetic resonance apparatus substantially correspond to the advantages of the method for ascertaining an item of movement information concerning movement of an object under examination during a magnetic resonance scan as detailed above. Features, advantages or alternative embodiments may likewise also be transferred to the other claimed subject matter and vice versa.

Further, a computer program product is provided that includes a program and may be loaded directly into a memory of a programmable system control unit of a magnetic resonance apparatus and includes program code, for example libraries and auxiliary functions, in order to execute a method described herein when the computer program product is executed in the system control unit of the magnetic resonance apparatus. The computer program product may include software with a source code that still needs to be compiled and linked, or only has to be interpreted, or an executable software code that only needs to be loaded into the system control unit for execution.

The computer program product provides the method to be executed quickly, identically repeatedly and robustly. The computer program product is configured such that it may execute the respective method steps by the system control unit. The system control unit may in each case fulfil the requisite conditions such as, for example, including an appropriate random-access memory, an appropriate graphics card, or an appropriate logic unit so that the respective method steps may be executed efficiently.

The computer program product is, for example, stored on a computer-readable medium or on a network or server from where it may be loaded into the processor of a local system control unit, that may be directly connected to the magnetic resonance apparatus or configured as part of the magnetic resonance apparatus. Furthermore, control information of the computer program product may be stored on an electronically readable data carrier. The control information of the electronically readable data carrier may be configured to perform a method as described above when the data carrier is used in a system control unit of a magnetic resonance apparatus.

Examples of electronically readable data carriers are DVDs, magnetic tapes or USB sticks on which electronically readable control information, for example software, is stored. When this control information is read from the data carrier and stored in a system control unit of the magnetic resonance apparatus, all the embodiments according to the methods as described herein may be performed. For example, embodiments may also be based on the computer-readable medium and/or the electronically readable data carrier.

BRIEF DESCRIPTION OF THE FIGURES

Further advantages, features and details will be apparent from the embodiments described below and with reference to the drawings. Corresponding parts are given the same reference symbols in all figures.

FIG. 3 depicts a first pilot tone received signal, a second pilot tone received signal and a corrected first pilot tone received signal according to an embodiment.

DETAILED DESCRIPTION

Figure 1:
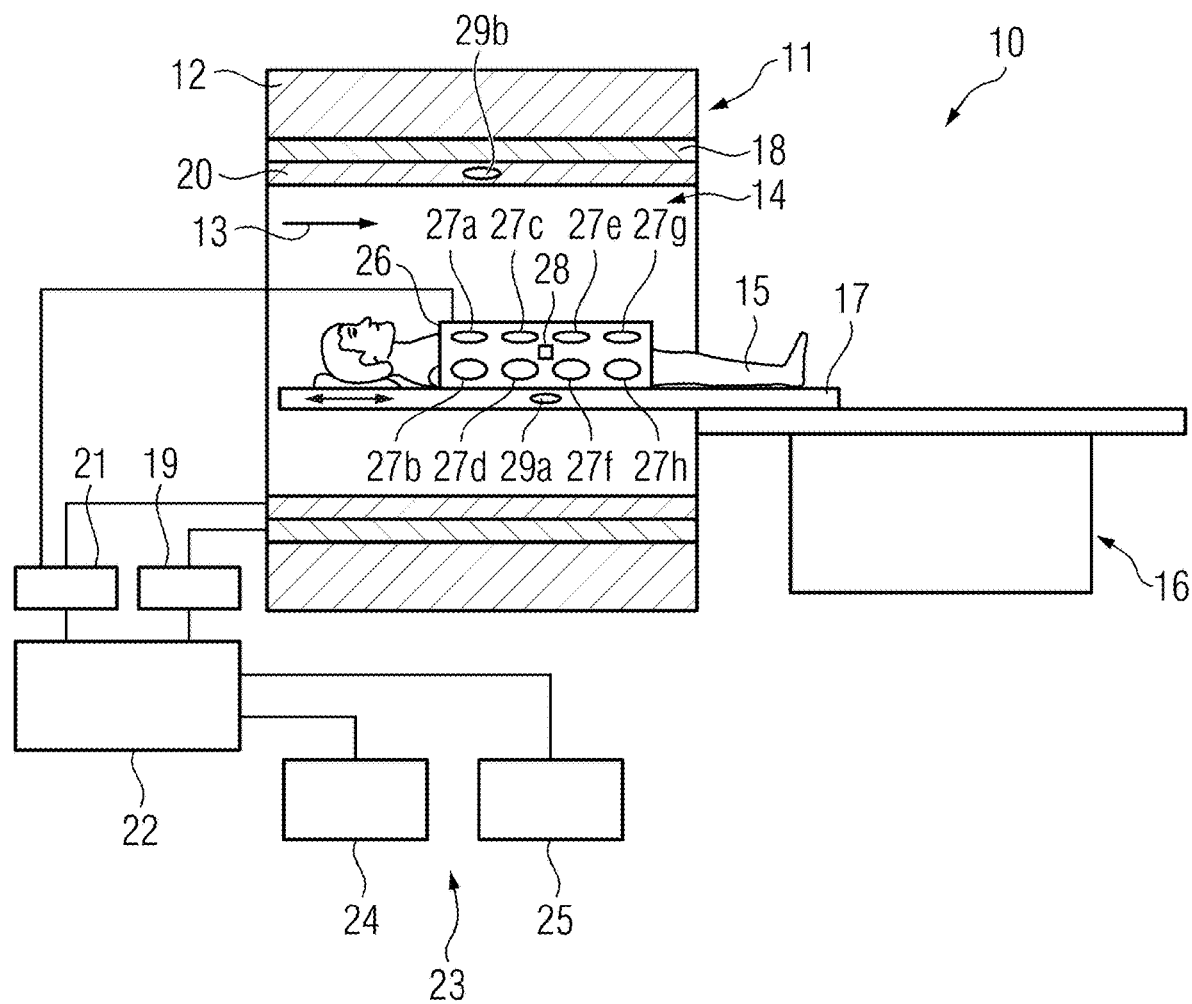
FIG. 1 depicts a schematic representation of a magnetic resonance apparatus according to an embodiment.

FIG. 1 is a schematic representation of a magnetic resonance apparatus 10. The magnetic resonance apparatus 10 includes a magnet unit 11, which includes a main magnet 12 for generating a strong and for example temporally constant main magnetic field 13. Moreover, the magnetic resonance apparatus 10 includes a patient receiving region 14 for receiving an object under examination, here a patient 15. In the present embodiment, the patient receiving region 14 is cylindrical in shape and surrounded by the magnet unit 11 in a cylindrical shape in a circumferential direction. In principle, however, the patient receiving region 14 may always be configured differently. The patient 15 may be pushed into the patient receiving region 14 by a patient support apparatus 16 of the magnetic resonance apparatus 10. For this purpose, the patient support apparatus 16 includes a patient table 17 configured to be able to move within the patient receiving region 14.

The magnet unit 11 further includes a gradient coil unit 18 for generating magnetic field gradients, that are used for spatial encoding during imaging. The gradient coil unit 18 is controlled by a gradient control unit 19 of the magnetic resonance apparatus 10. The magnet unit 11 further includes a radio-frequency antenna unit 20, that, in the present embodiment, is configured as a body coil that is permanently integrated in the magnetic resonance apparatus 10. The radio-frequency antenna unit 20 is controlled by a radio-frequency antenna control unit 21 of the magnetic resonance apparatus 10 and radiates radio-frequency RF signals, for example atomic nuclei to be excited according to the Larmor frequency, into an examination area substantially formed by a patient receiving region 14 of the magnetic resonance apparatus 10. As a result, excitation of atomic nuclei is established in the main magnetic field 13 generated by the main magnet 12. Magnetic resonance signals, for example according to the Larmor frequency of the excited atomic nuclei, are generated by relaxation of the excited atomic nuclei. The radio-frequency antenna unit 20 is configured to receive the magnetic resonance signals.

The magnetic resonance apparatus 10 includes a system control unit 22 to control the main magnet 12, the gradient control unit 19 and the radio-frequency antenna control unit 21. The system control unit 22 centrally controls the magnetic resonance apparatus 10, for example, by performing a predetermined imaging magnetic resonance sequence. Moreover, the system control unit 22 includes an evaluation unit (not shown in further detail) for evaluating the magnetic resonance signals captured during the magnetic resonance examination. In addition, the magnetic resonance apparatus 10 includes a user interface 23 connected to the system control unit 22. Control information such as, for example, imaging parameters and reconstructed magnetic resonance images may be displayed on a display unit 24, for example on at least one monitor, of the user interface 23 for a medical operator. The user interface 23 further includes an input unit 25 by which the medical operator may input information and/or parameters during a scanning process.

In addition, the magnetic resonance apparatus includes a local coil 26 positioned directly on the patient 15. The local coil includes a plurality of coil elements 27a-h, that are for example configured to receive RF signals. Such RF signals may for example be magnetic resonance signals and/or pilot tone signals. For example, the coil elements 27a-h include a receiving frequency band that includes the frequency band of the magnetic resonance signals and the frequency band of the pilot tone signals. The received RF signals may be transmitted to the system control unit 22. The coil elements 27a-h may be configured not only to receive, but also to transmit RF signals.

In the example depicted here, the local coil further includes a pilot tone signal generator 28. The pilot tone signal generator 28 integrated in the local coil 26 is mounted close to a location of movement to be ascertained, such as, for example, a heart or respiratory movement. Hence, any pilot tone signal may be picked up with a particularly high SNR. However, in principle, a pilot tone signal generator may also be arranged elsewhere in the magnetic resonance apparatus. Pilot tone signals received by the coil elements, that are influenced as strongly as possible by a movement of the patient 15 to be observed, may also be referred to as first pilot tone received signals. The first pilot tone received signals are primarily the carriers of the information about the movement of the patient 15. The coil elements receiving the first pilot tone received signals may be referred to as first coil elements. Therefore, the first coil elements may include high sensitivity to the movement of the patient 15 to be observed.

The magnetic resonance apparatus further includes coil elements for the reception of pilot tone signals that are to be influenced as little as possible by a movement of the patient 15 to be observed. Such pilot tone signals received by the coil elements may also be referred to as second pilot tone received signals. Therefore, the second coil elements preferably include a low, ideally vanishing, sensitivity to the movement of the patient 15 to be observed.

Such second coil elements may for example be coil elements that are present anyway, such as, for example, the local coil 26 depicted in FIG. 1. Herein, for example, suitable coil elements are coil elements that are not used for imaging, such as, for example, coil elements at the foot end of the spine coil when a head examination is performed.

The magnetic resonance apparatus 10 further includes coil elements 29a-b for the dedicated reception of second pilot tone received signals. Accordingly, the coil elements 29a-b are second coil elements. (To receive the pilot tone signals, it would be sufficient for the coil elements 29a-b to have a receiving frequency band including only the frequency band of the pilot tone signals, but not the frequency band of the magnetic resonance signals). For example, suitable second coil elements are small pick-up antennas attached to one of the local coils (but for example not used for imaging), or any coil elements in the patient table 17 (such as the coil element 29a in this case), in the radio-frequency antenna unit 20 (such as the coil element 29b in this case), on the cover of the magnetic resonance apparatus. For example, dedicated coil elements may also be arranged close to the location of potential vibration, such as, for example, on a cold head of the main magnet 12.

Therefore, both the first coil elements and the second coil elements are configured to receive pilot tone signals. However, the pilot tone signals received by the first coil elements, i.e., the first pilot tone received signals, are processed differently than the pilot tone signals received by the second coil elements, i.e., the first pilot tone received signals. Depending on the magnetic resonance scan, a coil element may function as a first coil element or as a second coil element, i.e., a specific coil element may, for example, be a first coil element in one magnetic resonance scan (for example, because it includes high sensitivity to movement in this scan) and a second coil element in another magnetic resonance scan (in particular, because it includes low sensitivity to movement in this scan).

A possible selection of second coil elements may for example be realized by using further information relating to the magnetic resonance apparatus 10. Preferably desirable is a relatively large distance to the physiological movement to be captured by the pilot tone technique, but a rather short distance to the pilot tone signal generator 28. In particular, the selection of second coil elements may take place based on information concerning the positions of the coil elements and/or a patient model. The patient model includes, for example, information about where the heart of the patient 15 is beating and/or where the patient's breathing is taking place. A suitable selection of second coil elements may provide the undesired signal to be picked up and suppressed, but also ensure that the desired signal is not unintentionally suppressed.

Figure 2:
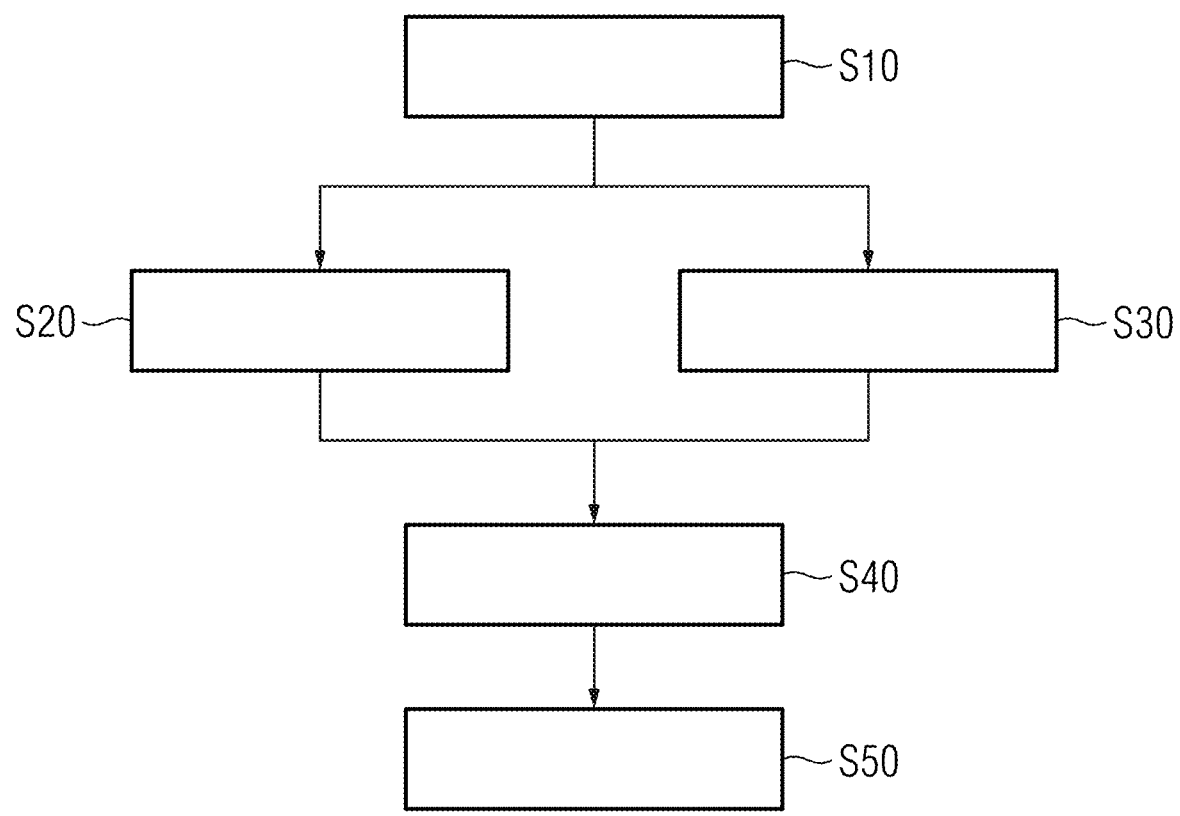
FIG. 2 depicts a method for ascertaining an item of movement information concerning movement of an object under examination during a magnetic resonance scan according to an embodiment.

FIG. 2 is a schematic representation of a method for ascertaining an item of movement information concerning movement of an object under examination during a magnetic resonance scan. In S10, the pilot tone signal generator 28 transmits a pilot tone signal into the patient receiving region 14. The pilot tone signal interacts with the patient 15.

In S20, the pilot tone signal is received by first coil elements of the magnetic resonance apparatus 10. The pilot tone signal received by the first coil elements is in each case a first pilot tone received signal. If, for example, a heart movement is to be ascertained on the basis of the pilot tone signals, the coil elements 27a, 27b, 27c and 27d are particularly suitable as first coil elements, since these coil elements are located close to the heart of the patient 15. The pilot tone signals received are then first pilot tone received signals, i.e., each of the coil elements 27a, 27b, 27c and 27d receives in each case a first pilot tone received signal, so that a total of four first pilot tone received signals are received.

In S30, the pilot tone signal is received by second coil elements of the magnetic resonance apparatus 10. The pilot tone signal received by the second coil elements is in each case a second pilot tone received signal. If, for example, a heart movement is to be ascertained on the basis of the pilot tone signals, the coil elements 27g, 27h and 29b are particularly suitable as second coil elements, since these coil elements are located far away from the heart of the patient 15. For example, in S30, at least one second pilot tone received signal located outside a region is received in a physiological movement occurs that is to be ascertained with the pilot tone signal. For example, at least one coil element that includes no sensitivity or only very low sensitivity in the region in which the movement of the patient 15 takes place is selected as the first coil element.

The pilot tone signals received by the second coil elements are then second pilot tone received signals, i.e., each of the coil elements 27g, 27h and 29b receives in each case a second pilot tone received signal, so that in this example a total of three first pilot tone received signals are received.

In S40, the first pilot tone received signals are corrected with the aid of the second pilot tone received signals, for example by the system control unit 22. For example, herein, any interference signals present in both the first pilot tone received signals and the second pilot tone received signals are deducted from the first pilot tone received signals.

A possible interference signal may for example be caused by a vibration in or on the magnetic resonance apparatus. If, for example, such a vibration causes the pilot tone signal generator 28 to move relative to the coil elements receiving the pilot tone signal, this movement may cause modulation of the amplitude and/or phase of the received pilot tone signal. Advantageously, this also provides interference signals resulting from further movements in the room (such as, for example, movement parts or people walking around) to be reduced.

In S50, an item of movement information for the object under examination using the corrected at least one first pilot tone received signal, once again, for example by the system control unit 22. The removal of any interference signals in S40 now renders the item of movement information more accurate and/or more robust than without correction.

FIG. 3 depicts a first pilot tone received signal $PT_1$, a second pilot tone received signal $PT_2$ and a corrected first pilot tone received signal $PT_{1,cor}$. The first pilot tone received signal $PT_1$ is, for example, received by the first coil element 29a in S20. It describes, for example, a respiratory movement, that is, however, superimposed by interference signals. In S30, the second second pilot tone received signal $PT_2$ is, for example, received by the second coil element 27h. It is far enough away from the abdomen of the patient 15 that it does not describe the respiratory movement of the patient 15, but only describes the interference signals which are also superimposed on the first pilot tone received signal $PT_1$. In S40, the first pilot tone received signal $PT_1$ is corrected with the aid of the second pilot tone received signal $PT_2$ resulting in the corrected first pilot tone received signal $PT_{1,cor}$. This now no longer includes the interference signals.

In S40, the second pilot tone received signal $PT_2$ is, for example, weighted and subtracted from all first pilot tone received signals—i.e., for example the signal pilot tone received signal $PT_1$, —but also from other first pilot tone received signals received by any other first coil elements: $PT_{1,cor}=PT_1-G\cdot PT_2$, wherein G is a, possibly complex-valued, weighting factor. For M first pilot tone received signals and N second pilot tone received signals, the weighting may be represented as a matrix of M×N weighting factors.

Figure 7:
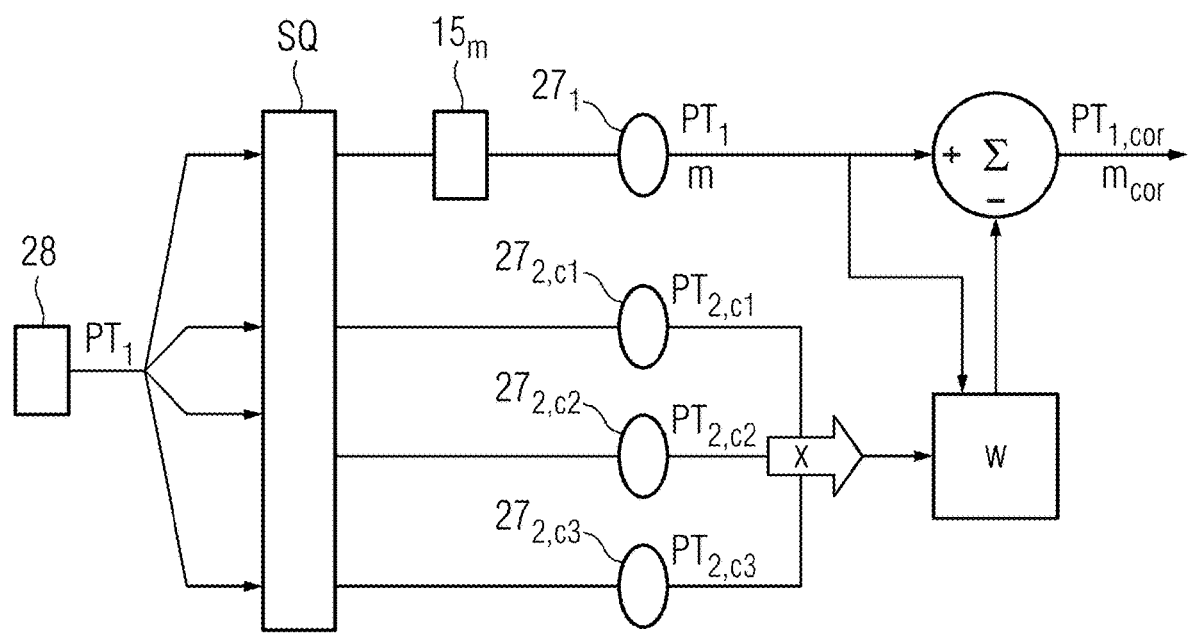
FIG. 7 depicts a schematic representation of a correction of a first pilot tone received signal with the aid of second pilot tone received signals according to an embodiment.

The weighting factor may be ascertained in various ways. For example, the weighting factors or the interference-free pilot tone received signals are calculated with the aid of a method as illustrated in FIG. 7, for example a sidelobe canceller method.

According to S10, the pilot tone signal generator 28 emits a pilot tone signal $PT_t$. The pilot tone signal $PT_t$ interacts with an, for example moving, interference source SQ, for example part of the magnetic resonance apparatus 10, so that the pilot tone signal includes an interference signal after this interaction. The interference source SQ may, for example, be a vibrating coolant line of the magnetic resonance apparatus 10. However, the interference source SQ may also, for example, be one or more people moving in the vicinity of the magnetic resonance apparatus 10 during the magnetic resonance scan.

The pilot tone signal $PT_t$ also partially interacts with a moving part of the patient 15, for example the heart (heartbeat) and/or the abdomen (respiratory movement). This movement may ultimately be ascertained with the aid of the pilot tone signal.

According to S20, a first coil element $27_1$ positioned close to the movement process for which an item of movement information is to be ascertained receives a first pilot tone received signal $PT_1$. (A plurality of coil elements may be positioned close to the movement process and are thus first coil elements for receiving a first pilot tone received signal in each case.)

According to S30, three second coil elements $27_{2,c1}$, $27_{2,c2}$, $27_{2,c3}$, that are positioned remotely from the movement process for which an item of movement information is to be ascertained and thereby have lower sensitivity for capturing the movement of the object under examination 15 than the one first coil element $27_1$, in each case receive a second pilot tone received signal $PT_{2,c1}$, $PT_{2,c2}$, $PT_{2,c3}$. There may be more or less than three second coil elements.

Before subtracting the second pilot tone received signals $PT_{2,c1}$, $PT_{2,c2}$, $PT_{2,c3}$ from the first pilot tone received signal $PT_1$ for correction, the second pilot tone received signals $PT_{2,c1}$, $PT_{2,c2}$, $PT_{2,c3}$ are weighted. The weighting may increase the quality of the correction, for example the removal of the interference signal from the first pilot tone received signal $PT_1$.

The correction in S40 presented below is particularly effective when the interference signal is correlated between the channels of the first coil element $27_1$ and the second coil elements $27_{2,c1}$, $27_{2,c2}$, $27_{2,c3}$, and when the above-described interference signal is dominant in the channels of the second coil elements $27_{2,c1}$, $27_{2,c2}$, $27_{2,c3}$. The second pilot tone received signals $PT_{2,c1}$, $PT_{2,c2}$, $PT_{2,c3}$ may only consist of the interference signal.

The second pilot tone received signals $PT_{2,c1}$, $PT_{2,c2}$, $PT_{2,c3}$ are transformed into an orthonormal base, i.e., $X(\vec{PT}_2)=\vec{PT}_{2,orthonorm}$, and correlated with the first pilot tone received signal $PT_1$. The correlation may be described in a 1×3 correlation matrix K1. The correlation coefficients of the correlation matrix K1 provide the weights to be used in the subsequent subtraction.

The first pilot tone received signals $PT_1$ may be represented as vector m and the correlation coefficients as vector w. The following relationship results in the case of an orthonormal base: $w = K1^H \cdot m$.

Written as vector $m_{cor}$, the following is obtained for the corrected first pilot tone received signals $PT_{1,cor}$: $m_{cor} = m - K1 \cdot w$.

Figure 4:
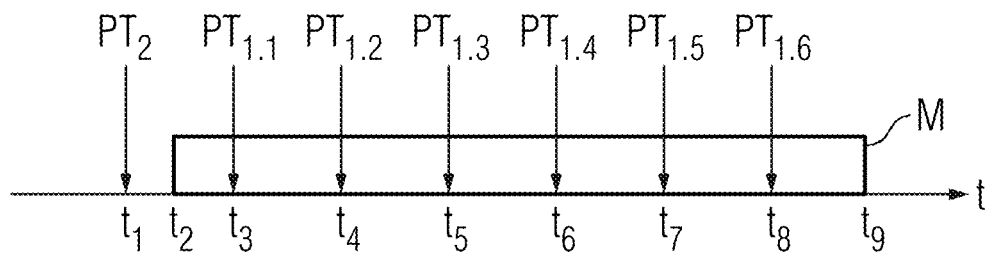
FIG. 4-6 depict different sequences for picking up the pilot tone received signals according to an embodiment.
Figure 5:
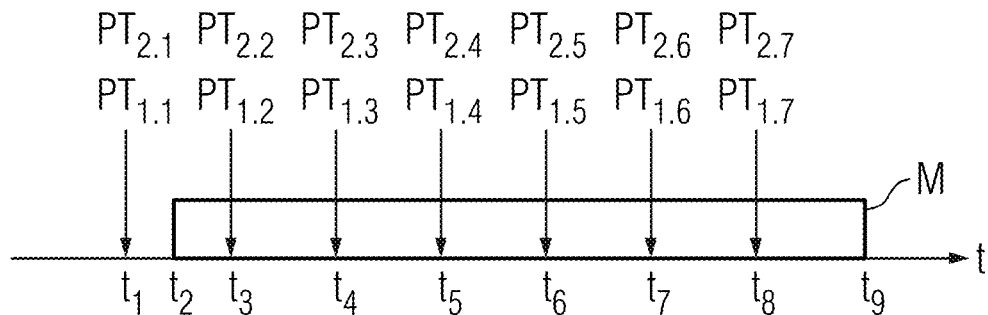
Figure 6:
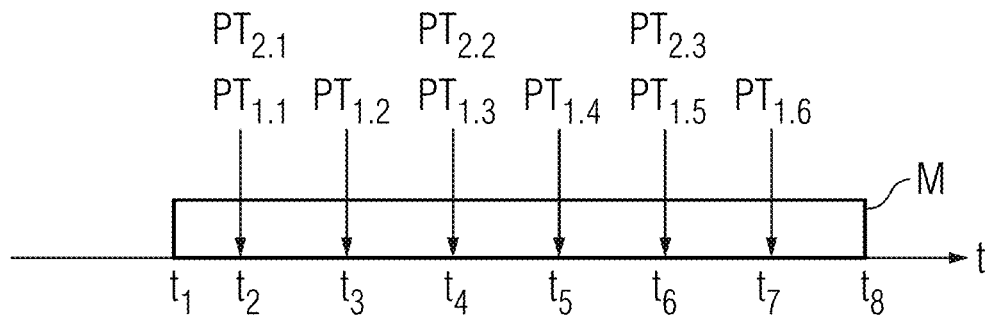

FIGS. 4-6 depict different variants of the temporal sequence in which the first and second pilot tone received signals may be picked up. For the sake of simplicity, here it is assumed, that, at each of the times $t_x$ shown, always only one first pilot tone received signal according to S20 or only one second pilot tone received signal according to S30 is picked up. A plurality of such signals (with different coil elements) may be picked up.

For example, according to FIG. 4, a second pilot tone received signal $PT_2$ is picked up at time $t_1$. At time $t_2$, the magnetic resonance scan M begins, i.e., from $t_2$ magnetic resonance signals are captured from which one or more magnetic resonance images may be reconstructed. A first first pilot tone received signal $PT_{1.1}$ is received or picked up at time $t_3$, a second first pilot tone received signal $PT_{1.2}$ is received or picked up at time $t_4$, and so on.

Such a variant may be suitable if the interference to be reduced occurs continuously and not only at certain times; based on the second pilot tone received signal $PT_2$, a filter, for example a frequency filter, may be created, for example, and applied in S40 to the first pilot tone received signals $PT_{1.1}, \ldots, PT_{1.6}$, in order to obtain the corrected first pilot tone received signals.

A further variant is depicted in FIG. 5. Here, at each of the times $t_1, t_3, \ldots t_8$, both a first pilot tone received signal $PT_{1.1}, \ldots, PT_{1.6}$ and a second pilot tone received signal $PT_{2.1}, \ldots, PT_{2.6}$ are received for further processing.

For example, the ascertaining of weights, for example weighting factors, may be started before the scan M based on the signals received at time $t_1$. Herein, the precalculated weights may be continuously adapted over the magnetic resonance scan M. Herein, the weight adaptation may be limited in order to stabilize the method, for example by defining limits for a change of the weighting factors between two time segments, for example between $t_3$ and $t_4$. This may provide for correction in S30 also to respond to a temporally changing interference environment.

Further variants may be used, such as, for example, that are shown in FIG. 6. In FIG. 6, during the magnetic resonance scan M, a second pilot tone received signal is also only picked up at every second time. Depending on the dynamics of changing interference effects, this may also be sufficient and save calculation capacity.

Reference is made once again to the fact that the method and magnetic resonance apparatus described above are only embodiments that may be modified in wide ranges by the person skilled in the art without departing from the scope of the invention. Furthermore, the use of the indefinite article "a" or "an" does not preclude the possibility that the features in question may also be present on a multiple basis. Similarly, the term "unit" does not preclude the possibility that the components in question may consist of a plurality of interacting sub-components which may also be spatially distributed.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for ascertaining an item of movement information concerning movement of an object under examination during a magnetic resonance scan, the method comprising:
   transmitting a pilot tone signal by a pilot tone signal generator of a magnetic resonance apparatus;
   receiving the pilot tone signal by at least one first coil element of the magnetic resonance apparatus as an at least one first pilot tone received signal;
   receiving the pilot tone signal by at least one second coil element of the magnetic resonance apparatus as an at least one second pilot tone received signal;
   correcting the first pilot tone received signal with the at least one second pilot tone received signal; and
   ascertaining an item of movement information for the object under examination using the corrected at least one first pilot tone received signal.

2. The method of claim 1, wherein the at least one second coil element is configured with a lower sensitivity for capturing the movement of the object under examination than the at least one first coil element.

3. The method of claim 1, wherein the correction of the at least one first pilot tone received signal with the at least one second pilot tone received signal comprises a subtraction of the at least one second pilot tone received signal from the at least one first pilot tone received signal.

4. The method of claim 3, wherein at least one weighting factor is ascertained, wherein the subtraction of the at least one second pilot tone received signal from the at least one first pilot tone received signal is performed with the at least one weighting factor.

5. The method of claim 1, wherein the correction of the at least one first pilot tone received signal uses a sidelobe canceller method, a trained function, or the sidelobe canceller method and the trained function.

6. The method of claim 1, wherein the reception of the at least one second pilot tone received signal takes place repeatedly during the magnetic resonance scan, wherein the correction of the at least one first pilot tone received signal is performed based on the repeatedly received at least one second pilot tone received signal during the magnetic resonance scan.

7. The method of claim 1, wherein the reception of the at least one second pilot tone received signal takes place repeatedly, continuously, or repeatedly and continuously during the magnetic resonance scan, wherein a strength of an adaption is ascertained to correct the at least one first pilot tone received signal with the repeatedly, continuously, or repeatedly and continuously received at least one second pilot tone received signal during the magnetic resonance scan, wherein the adaption only takes place when the strength of the adaption exceeds a predetermined threshold.

8. The method of claim 1, wherein the at least one second coil element of the magnetic resonance apparatus comprises at least one coil element that does not capture any magnetic resonance signals during the magnetic resonance scan used to ascertain a magnetic resonance image.

9. The method of claim 1, wherein there is a greater distance between a location of the movement of the object and the at least one second coil element than between the location of movement of the object and the at least one first coil element.

10. The method of claim 1, wherein the at least one second coil element is selected from a plurality of coil elements of the magnetic resonance apparatus, wherein the selection of the at least one second coil element takes place in dependence on a position of the coil elements or using a patient model.

11. A magnetic resonance system for ascertaining an item of movement information concerning movement of an object under examination during a magnetic resonance scan, the magnetic resonance system comprising:
- a pilot tone signal generator configured to transmit a pilot tone signal;
- at least one first coil element configured to receive the pilot tone signal as an at least one first pilot tone received signal;
- at least one second coil element configured to receive the pilot tone signal as an at least one second pilot tone received signal; and
- a processor configured to correct the at least one first pilot tone received signal with the at least one second pilot tone received signal and ascertain an item of movement information for the object under examination using the corrected at least one first pilot tone received signal.

12. The magnetic resonance system of claim 11, wherein the at least one second coil element is configured with a lower sensitivity for capturing the movement of the object under examination than the at least one first coil element.

13. The magnetic resonance system of claim 11, wherein the correction of the at least one first pilot tone received signal with the at least one second pilot tone received signal comprises a subtraction of the at least one second pilot tone received signal from the at least one first pilot tone received signal.

14. The magnetic resonance system of claim 13, wherein at least one weighting factor is ascertained, wherein the subtraction of the at least one second pilot tone received signal from the at least one first pilot tone received signal is performed with the at least one weighting factor.

15. The magnetic resonance system of claim 11, wherein the correction of the at least one first pilot tone received signal uses a sidelobe canceller method, a trained function, or the sidelobe canceller method and the trained function.

16. The magnetic resonance system of claim 11, wherein the reception of the at least one second pilot tone received signal takes place repeatedly during the magnetic resonance scan, wherein the correction of the at least one first pilot tone received signal is performed based on the repeatedly received at least one second pilot tone received signal during the magnetic resonance scan.

17. The magnetic resonance system of claim 11, wherein the reception of the at least one second pilot tone received signal takes place repeatedly, continuously, or repeatedly and continuously during the magnetic resonance scan, wherein a strength of an adaption is ascertained to correct the at least one first pilot tone received signal with the repeatedly, continuously, or repeatedly and continuously received at least one second pilot tone received signal during the magnetic resonance scan, wherein the adaption only takes place when the strength of the adaption exceeds a predetermined threshold.

18. The magnetic resonance system of claim 11, wherein the at least one second coil element of the magnetic resonance system comprises at least one coil element that does not capture any magnetic resonance signals during the magnetic resonance scan used to ascertain a magnetic resonance image.

19. The magnetic resonance system of claim 11, wherein there is a greater distance between a location of the movement of the object and the at least one second coil element than between the movement of the object and the at least one first coil element.

20. A non-transitory computer implemented storage medium that stores machine-readable instructions executable by at least one processor, the machine-readable instructions for ascertaining an item of movement information concerning movement of an object under examination during a magnetic resonance scan, the machine-readable instructions comprising:
- transmitting a pilot tone signal by a pilot tone signal generator of a magnetic resonance apparatus;
- receiving the pilot tone signal by at least one first coil element of the magnetic resonance apparatus as an at least one first pilot tone received signal;
- receiving the pilot tone signal by at least one second coil element of the magnetic resonance apparatus as an at least one second pilot tone received signal;
- correcting the at least one first pilot tone received signal with the at least one second pilot tone received signal; and
- ascertaining an item of movement information for the object under examination using the corrected at least one first pilot tone received signal.

* * * * *